United States Patent
Minakata et al.

(10) Patent No.: US 11,912,011 B2
(45) Date of Patent: Feb. 27, 2024

(54) COMPOSITE SHEET AND METHOD FOR MANUFACTURING SAME, AND LAMINATE AND METHOD FOR MANUFACTURING SAME

(71) Applicant: Denka Company Limited, Tokyo (JP)

(72) Inventors: Yoshitaka Minakata, Tokyo (JP); Tomoya Yamaguchi, Tokyo (JP); Saori Inoue, Tokyo (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 17/770,513

(22) PCT Filed: Oct. 21, 2020

(86) PCT No.: PCT/JP2020/039615
§ 371 (c)(1),
(2) Date: Apr. 20, 2022

(87) PCT Pub. No.: WO2021/079918
PCT Pub. Date: Apr. 29, 2021

(65) Prior Publication Data
US 2022/0410530 A1    Dec. 29, 2022

(30) Foreign Application Priority Data
Oct. 23, 2019    (JP) ................................. 2019-192948

(51) Int. Cl.
| | |
|---|---|
| B32B 9/00 | (2006.01) |
| B32B 5/14 | (2006.01) |
| B32B 15/08 | (2006.01) |
| B32B 15/20 | (2006.01) |
| B32B 37/14 | (2006.01) |
| B32B 37/16 | (2006.01) |
| B32B 43/00 | (2006.01) |

(52) U.S. Cl.
CPC .............. *B32B 9/005* (2013.01); *B32B 5/147* (2013.01); *B32B 15/08* (2013.01); *B32B 15/20* (2013.01);
(Continued)

(58) Field of Classification Search
None
See application file for complete search history.

(56) References Cited

U.S. PATENT DOCUMENTS

2019/0092695 A1*  3/2019  Nishi ...................... B32B 15/08
2020/0031723 A1*  1/2020  Inoue ...................... C04B 41/83

FOREIGN PATENT DOCUMENTS

| JP | H08-091960 A | 4/1996 |
| JP | H08-244163 A | 9/1996 |

(Continued)

OTHER PUBLICATIONS

The International Bureau of WIPO, International Preliminary Report on Patentability in International Application No. PCT/JP2020/039615 (dated May 5, 2022).

(Continued)

*Primary Examiner* — Seth Dumbris
(74) *Attorney, Agent, or Firm* — Leydig, Voit & Mayer, Ltd.

(57) ABSTRACT

One aspect of the present invention provides a composite sheet which comprises a nitride sintered body having a porous structure and a semi-cured product of a thermosetting resin composition impregnated into the nitride sintered body, the line roughness Rz specified by JIS B 0601:2013 of at least one main surface being 10 µm or less.

10 Claims, 5 Drawing Sheets

(52) U.S. Cl.
CPC ............ *B32B 37/144* (2013.01); *B32B 37/16* (2013.01); *B32B 43/003* (2013.01); *B32B 2250/03* (2013.01); *B32B 2250/40* (2013.01); *B32B 2260/046* (2013.01); *B32B 2305/74* (2013.01); *B32B 2305/80* (2013.01); *B32B 2307/538* (2013.01); *B32B 2309/02* (2013.01); *B32B 2309/12* (2013.01); *B32B 2311/12* (2013.01); *B32B 2311/24* (2013.01); *B32B 2315/02* (2013.01); *B32B 2398/10* (2013.01)

(56) References Cited

FOREIGN PATENT DOCUMENTS

| | | |
|---|---|---|
| JP | 2003-037382 A | 2/2003 |
| JP | 2006-206393 A | 8/2006 |
| JP | 2007-173338 A | 7/2007 |
| JP | 2010-153538 A | 7/2010 |
| JP | 2011-176024 A | 9/2011 |
| JP | 2016-103611 A | 6/2016 |
| JP | 2016103611 A * | 6/2016 |
| WO | WO 2014/196496 A1 | 12/2014 |
| WO | WO-2017155110 A1 * | 9/2017 ............ B32B 15/08 |
| WO | WO 2018/181606 A1 | 10/2018 |
| WO | WO-2018181606 A1 * | 10/2018 ............ B32B 18/00 |

OTHER PUBLICATIONS

Japan Patent Office, International Search Report in International Application No. PCT/JP2020/039615 (dated Dec. 22, 2020).

Japan Patent Office, Written Opinion in International Application No. PCT/JP2020/039615 (dated Dec. 22, 2020).

* cited by examiner

COMPOSITE SHEET AND METHOD FOR MANUFACTURING SAME, AND LAMINATE AND METHOD FOR MANUFACTURING SAME

CROSS-REFERENCE TO RELATED APPLICATIONS

This patent application is the U.S. national phase of International Application No. PCT/JP2020/039615, filed on Oct. 21, 2020, which claims the benefit of Japanese Patent Application No. 2019-192948, filed Oct. 23, 2019, the disclosures of which are incorporated herein by reference in their entireties for all purposes.

TECHNICAL FIELD

The present disclosure relates to a composite sheet and a method for producing the same, and a laminate and a method for producing the same.

BACKGROUND ART

In electronic components such as LED lighting equipment and in-vehicle power modules, there is a problem of efficient dissipation of heat generated during use. Against this problem, there are taken measures such as a method of making an insulating layer of a printed wiring board on which an electronic component is mounted highly thermally conductive, and a method of attaching an electronic component or a printed wiring board to a heat sink via electrically insulating thermal interface materials. For such an insulating layer and thermal interface materials, used is a composite (heat dissipation member) composed of a resin and ceramics such as boron nitride.

As such a composite, a composite obtained by dispersing ceramic powder in a resin has been conventionally used. In recent years, composites obtained by impregnating a porous ceramic sintered body (e.g., a boron nitride sintered body) with a resin also have been studied (e.g., Patent Literature 1 and the like).

In addition, it has also been studied that a circuit board is brought into direct contact with primary particles constituting the boron nitride sintered body to lower the thermal resistance of the laminate to thereby improve the heat dissipation properties. For example, Patent Literature 2 describes a method for producing a laminate by heat- and pressure-bonding a circuit board having a surface arithmetic average roughness Ra adjusted with a composite including a boron nitride sintered body, and intruding the composite while the composite is deformed by use of a protrusion on the surface on the side of the adhesive layer of the circuit board described above.

CITATION LIST

Patent Literature

Patent Literature 1: International publication No. 2014/196496
Patent Literature 2: Japanese Unexamined Patent Publication No. 2016-103611

SUMMARY OF INVENTION

Technical Problem

However, in a laminate produced using a conventional composite sheet, variations may occur in heat dissipation properties, and there is room for improvement.

An object of the present disclosure is to provide a composite sheet having excellent heat dissipation properties when laminated with a metal substrate, and a method for producing the same. Another object of the present disclosure is to provide a laminate excellent in heat dissipation properties and a method for producing the same.

Solution to Problem

One aspect of the present disclosure provides a composite sheet comprising: a nitride sintered body having a porous structure; and a semi-cured product of a thermosetting resin composition impregnated into the nitride sintered body, line roughness Rz (maximum height), specified in JIS B 0601: 2013, on at least one principal surface of the composite sheet being 10 μm or less.

The composite sheet comprises the semi-cured product of the thermosetting composition and thus may adhere to an adherend. Since the linear roughness Rz on at least one principal surface of the composite sheet is small, variations in the thickness of the resin layer portion inferior in heat dissipation properties may be reduced at the interface when the composite sheet is connected to the adherend. Accordingly, a laminate excellent in heat dissipation properties may be produced.

When a laminate with a metal substrate is prepared using a conventional composite sheet, the thermal conductivity may vary according to the positions. Such variations in thermal conductivity according to the positions may be problematic in a field where high heat dissipation properties are required. In a conventional composite sheet, relatively large irregularities may be formed on a surface thereof. Thus, when the composite sheet is used for adhesion to a metal substrate, a resin layer having thicknesses different according to positions may be formed between the surface of the composite sheet and the metal substrate. The present inventors presume that this is responsible for variations that occur in the thermal conductivity of the laminate. On the other hand, in the composite sheet of the present disclosure, the principal surface is smoother, having fewer variations in the thicknesses of the resin layer as described above. Accordingly, it is considered that the above-described effect may be provided.

The arithmetic average roughness Ra, specified by JIS B 0601: 2013, on the principal surface may be 2.0 μm or less. When the arithmetic average roughness Ra on the principal surface is equal to or less than the predetermined value, variations in the in-plane heat dissipation properties at the interface with the adherend may be further reduced.

The content of the semi-cured product may be from 20 to 70% by volume. When the content of the semi-cured product is within the above range, adhesiveness on adhesion of the adherend and the composite sheet may be further improved. When the content of the semi-cured product is within the above range, the composite sheet also has excellent insulating properties after adhesion to the adherend.

The composite sheet may have a thickness of 1.0 mm or less.

One aspect of the present disclosure provides a method for producing a composite sheet, the method including cutting a resin-impregnated body comprising a nitride sintered body having a porous structure and a semi-cured product of a thermosetting resin composition impregnated into the nitride sintered body by use of a wire saw under conditions including a wire reciprocating linear speed of 155 to 1000 mm/min and a table moving speed of 4 mm/min, to obtain a composite sheet, at least one principal surface of the composite sheet having line roughness Rz (maximum height), specified by JIS B 0601: 2013, of 10 μm or less.

In the above-described method for producing a composite sheet, cutting the resin-impregnated body with a wire saw operated under predetermined conditions enables composite sheets to be produced, the composite sheets each having line roughness Rz on the principal surface equal to or less than a predetermined value.

The width of the resin-impregnated body may be from 5 to 150 mm. Setting the width of the resin-impregnated body within the above range can lead to a reduction in the contact distance between the resin-impregnated body and the wire, facilitating adjustment of the value of Rz on the principal surface (processed surface) of a composite sheet to be obtained.

One aspect of the present disclosure provides a laminate including a first metal substrate, an intermediate layer provided on the first metal substrate, and a second metal substrate provided on a side of the intermediate layer opposite to the first metal substrate, wherein the first metal substrate is connected to the second metal substrate via the intermediate layer, and the intermediate layer is a cured product of the composite sheet described above.

The laminate, to which the metal substrate is connected via the cured product of the composite sheet, is excellent in heat dissipation properties. In addition, in the laminate, to which the metal substrate is connected via the cured product of the composite sheet, variations in heat dissipation properties in the in-plane direction of the connection interface is reduced.

The principal surfaces of the first metal substrate and the second metal substrate on side of the intermediate layer may have line roughness Rz (maximum height), specified by JIS B 0601: 2013, of 10 μm or less.

At least one of the first metal substrate and the second metal substrate may contain at least one selected from the group consisting of copper and aluminum.

One aspect of the present disclosure provides a method for producing a laminate, the method including disposing and laminating each of a first metal substrate and a second metal substrate so as to face a pair of principal surfaces of the composite sheet described above, heating the first metal substrate and the second metal substrate while the first metal substrate and the second metal substrate are pressurized in a laminating direction to cure the thermosetting resin composition, thereby connecting the composite sheet with the first metal substrate and the second metal substrate.

The above-described method for producing a laminate, in which the composite sheet described above is used, enables a laminate excellent in heat dissipation properties to be produced.

Advantageous Effects of Invention

According to the present disclosure, there may be provided a composite sheet having excellent heat dissipation properties when laminated with a metal substrate, and a method for producing the same. According to the present disclosure, there also may be provided a laminate excellent in heat dissipation properties, and a method for producing the same.

DESCRIPTION OF EMBODIMENTS

Figure 1:
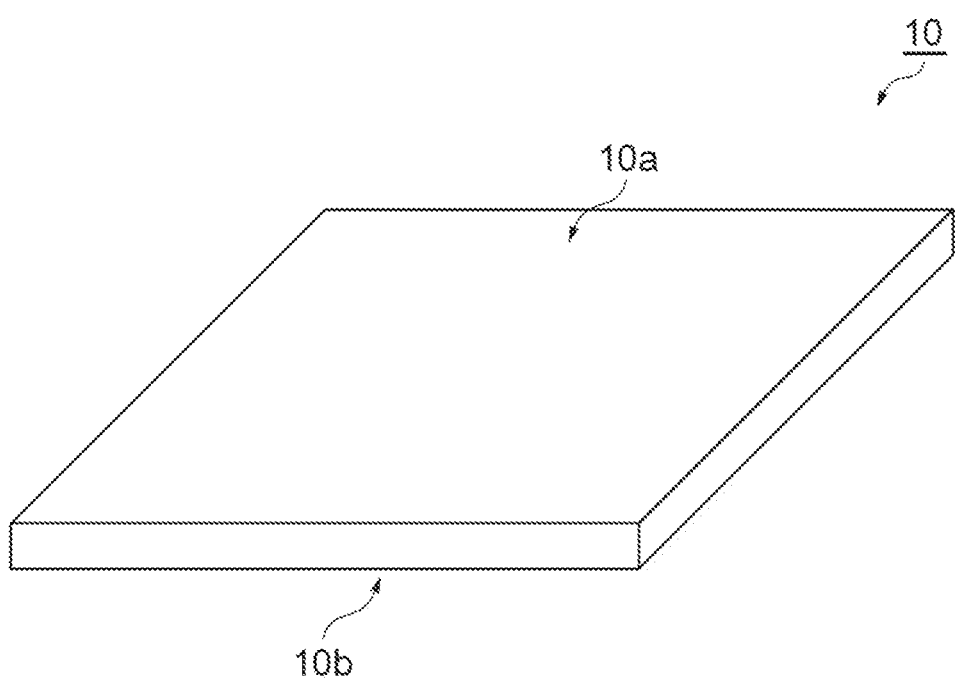
FIG. 1 is a perspective view illustrating an example of a composite sheet.

Hereinafter, embodiments of the present disclosure will be described with reference to the drawings, depending on cases. However, the following embodiments are examples for describing the present disclosure, and are not intended to limit the present disclosure to the following contents. In the description, the same reference numerals are used for the same elements or elements having the same functions, and repeated description will be omitted, depending on cases. The positional relationship such as up, down, left, and right is based on the positional relationship illustrated in the drawings, unless otherwise indicated. Furthermore, the dimensional ratio of each element is not limited to the ratio shown.

The materials exemplified in the present description can be used singly or in combination of two or more, unless otherwise indicated. The content of each component in the composition, when a plurality of substances corresponding to the component are present in the composition, means the total amount of the plurality of substances present in the composition, unless otherwise indicated.

One embodiment of the composite sheet includes a nitride sintered body having a porous structure, and a semi-cured product of a thermosetting resin composition impregnated into the nitride sintered body. The composite sheet of the present disclosure is useful as an adhesive member (e.g., an adhesive sheet) required to have thermal conductivity and insulating properties. The composite sheet of the present disclosure may be used specifically as an adhesive member for bonding a metal circuit board to other layers in a power module structure, an LED light emitting device, or the like.

Figure 2:
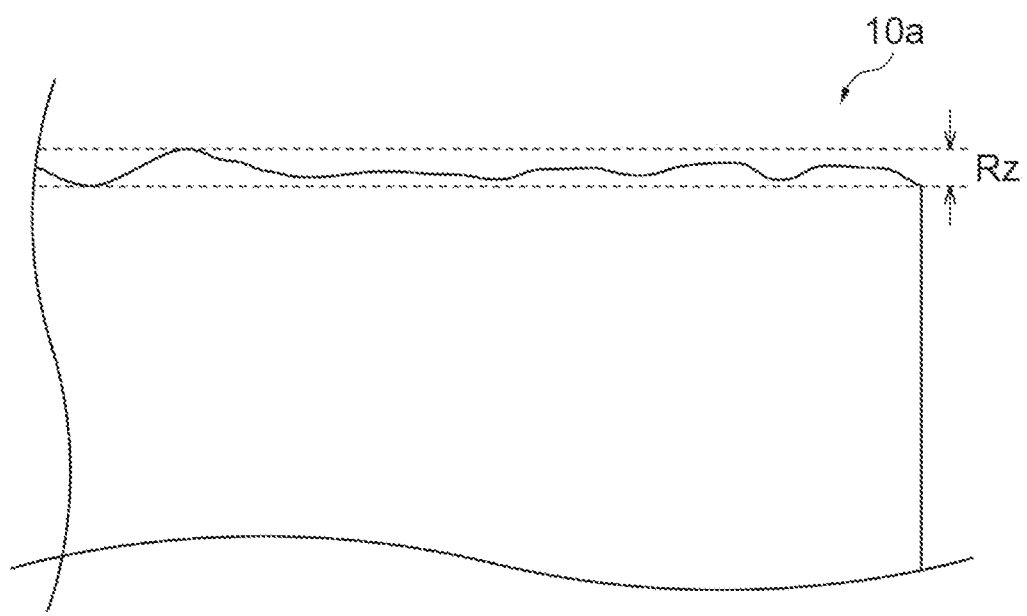
FIG. 2 is a partial end view of the composite sheet.

FIG. 1 is a perspective view illustrating an example of a composite sheet. The composite sheet 10 has a pair of principal surfaces 10a and 10b. FIG. 2 is a partial end view of the composite sheet. FIG. 2 shows that one of the principal surfaces, 10a, of the composite sheet 10 has small line roughness Rz (maximum height).

In the present description, the "sheet" refers to a shape in which the ratio of the thickness (e.g., a value in mm) to the area of a principal surface (e.g., a value in mm$^2$) is 0.01 or less. A principal surface (at least one of the principal surface 10a and the principal surface 10b) of the composite sheet 10 is a processed surface newly formed (surface cut from a resin-impregnated body) in the production process. The resin-impregnated body may be referred to as an ingot.

In the composite sheet 10, at least one of the principal surfaces (at least one of the principal surface 10a and the principal surface 10b) has line roughness Rz (maximum height), specified by JIS B 0601: 2013, of 10 μm or less. The upper limit value of the line roughness Rz may be, for example, 7 μm or less, 5 μm or less, or 4.5 μm or less. When the upper limit value of the line roughness Rz is within the above range, the proportion of the resin layer portion when connected to the metal substrate may be reduced, and the heat dissipation properties may be further improved. The lower limit value of the line roughness Rz may be, for example, 0.5 μm or more, 1 μm or more, or 2 μm or more. The line roughness Rz of the composite sheet can also be controlled by adjusting, for example, the wire reciprocating linear speed on cutting out the composite sheet from the resin-impregnated body described below.

The upper limit value of the arithmetic average roughness Ra, defined by JIS B 0601: 2013, on the principal surface (at least one of the principal surface 10a and the principal surface 10b, the Rz of the principal surface being 10 μm or less) may be, for example, 2.0 μm or less, 1.8 μm or less, 1.5 μm or less, 1.2 μm or less, 1.0 μm or less, or 0.9 μm or less. When the arithmetic average roughness Ra is within the above range, variations in the in-plane heat dissipation properties at the interface with the adherend may be further reduced. The lower limit value of the arithmetic average roughness Ra may be, for example, 0.05 μm or more, 0.1 μm or more, or 0.5 μm or more. The arithmetic average roughness Ra of the composite sheet can also be controlled by adjusting, for example, a wire reciprocating linear speed on cutting out the composite sheet from the resin-impregnated body described below.

The upper limit value of the thickness of the composite sheet 10 may be, for example, 1.0 mm or less, 0.9 mm or less, 0.8 mm or less, or 0.7 mm or less. When the upper limit value of the thickness of the composite sheet 10 is within the above range, the thermal resistance of the composite sheet 10 itself may be further reduced. The lower limit of the thickness of the composite sheet 10 may be, for example, 0.15 mm or more, or 0.20 mm or more. When the lower limit value of the thickness of the composite sheet 10 is within the above range, more sufficient insulation properties may be exerted even when the laminate obtained using the composite sheet 10 is used at a high voltage.

Included are a nitride sintered body having a porous structure, and a semi-cured product of a thermosetting resin composition impregnated into the nitride sintered body. The nitride sintered body having a porous structure may be formed by sintering primary particles of the nitride. The nitride sintered body having a porous structure may be, for example, one formed by sintering primary particles of boron nitride (sintered body of boron nitride).

In the present description, the "porous structure" means a structure having a plurality of fine pores (hereinafter, also referred to as pores), and includes a structure in which at least some of the pores are connected to form continuous pores. The average pore size of the pores may be, for example, 7 μm or less, 6 μm or less, or 5 μm or less. When the average pore size is within the above range, the thermal conductivity of the composite may be improved. The average pore size of the pores may be, for example, 0.3 μm or more, 0.5 μm or more, or 0.7 μm or more. When the average pore size is within the above range, the pores are easily filled with the thermosetting composition, and the adhesiveness of the composite to the adherend may be further improved. In the present description, the "average pore size" means a value measured by a mercury intrusion method.

In the present description, a state of "semi-cured" (also referred to as a B stage) means that the semi-cured product is in a state in which the semi-cured product can be further cured by a subsequent curing treatment. By use of the semi-cured state, temporarily pressure-bonding the semi-cured product to an adherend such as a metal substrate and then heating the bonded product enables the semi-cured product to adhere to the adherend. The semi-cured product, which is in a semi-cured state, may be brought into a "completely cured" state (also referred to as a C stage) after subjected to a further curing treatment. Whether or not the semi-cured product in the composite is in a semi-cured state, in which the semi-cured product can be further cured, can be confirmed by, for example, a differential scanning calorimeter.

As described below, the semi-cured product of the thermosetting composition (hereinafter, may be simply referred to as the "semi-cured product") means a product in which the curing reaction of the thermosetting composition has progressed to a certain degree or more. Therefore, the semi-cured product of the thermosetting composition may include a thermosetting resin or the like obtained by reaction of raw material components in the thermosetting composition (a compound or the like contained in the thermosetting composition). The semi-cured product may include an unreacted compound or the like among the raw material components, in addition to the thermosetting resin.

The semi-cured product of the thermosetting composition may have, for example, at least one structural unit selected from the group consisting of a structural unit derived from a cyanate group, a structural unit derived from a bismaleimide group, and a structural unit derived from an epoxy group, may have at least two structural units selected from the group consisting of a structural unit derived from a cyanate group, a structural unit derived from a bismaleimide group, and a structural unit derived from an epoxy group, and may have a structural unit derived from a cyanate group, a structural unit derived from a bismaleimide group, and a structural unit derived from an epoxy group. When the semi-cured product of the thermosetting composition has a structural unit derived from a cyanate group, a structural unit derived from a bismaleimide group, and a structural unit derived from an epoxy group, the production of the composite is facilitated, and the adhesiveness between the composite and the adherend may be further improved.

The semi-cured product may have, for example, a structural unit derived from a cyanate group, may have a structural unit derived from a cyanate group and at least one structural unit selected from the group consisting of a structural unit derived from a bismaleimide group and a structural unit derived from an epoxy group, and may have all of a structural unit derived from a cyanate group, a structural unit derived from a bismaleimide group, and a structural unit derived from an epoxy group.

Examples of the structural unit having a cyanate group include a triazine ring. Examples of the structural unit derived from a bismaleimide group include a structure represented by the following formula (1). Examples of the structural unit derived from an epoxy group include a structure represented by the following general formula (2). These structural units can be detected by using $^1$H-NMR and $^{13}$C-NMR. These structural units can also be detected using GPC (gel permeation chromatography). The structural units described above are only required to be detected by either of NMR or GPC.

[Formula 1]

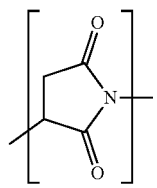

(1)

[Formula 2]

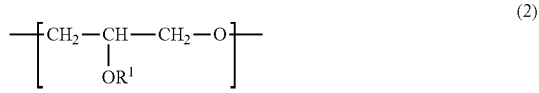

(2)

In the general formula (2), $R^1$ represents a hydrogen atom or any other functional group. The any other functional group may be, for example, an alkyl group.

The semi-cured product may have a structural unit other than the structural unit derived from a cyanate group, the structural unit derived from a bismaleimide group, and the structural unit derived from an epoxy group described above.

The semi-cured product may contain a thermosetting resin or may contain at least one selected from the group consisting of a cyanate resin, a bismaleimide resin, and an epoxy resin. The semi-cured product may contain, for example, a phenol resin, a melamine resin, a urea resin, or an alkyd resin, in addition to the thermosetting resin.

The semi-cured product may contain at least one curing agent selected from the group consisting of a phosphine-based curing agent and an imidazole-based curing agent. The phosphine-based curing agent may accelerate a triazine formation reaction by trimerization of a compound having a cyanate group. Examples of the phosphine-based curing agent include tetraphenylphosphonium tetra-p-tolylborate. The imidazole-based curing agent generates oxazoline and accelerates the curing reaction of the compound having an epoxy group. Examples of the imidazole-based curing agent include 1-(1-cyanomethyl)-2 ethyl-4 methyl-1H-imidazole. The semi-cured product may be a cured product formed by curing the polymerizable compound (e.g., a compound having a cyanate group, a compound having an epoxy group, or the like) contained in the thermosetting composition with these curing agents.

For the degree of curing of the semi-cured product, for example, the curing ratio of the thermosetting composition based on the curing ratio when a completely cured state is achieved, taken as 100%, may be used as an index. The curing ratio of the semi-cured product may be, for example, 70% or less, 65% or less, or 60% or less. When the curing ratio of the semi-cured product is within the above range, adhesiveness of the composite to the adherend may be improved. The semi-cured product moves in the resin composite to fill voids in the resin composite, and thus the dielectric breakdown voltage can be improved. The curing ratio when the resin is a semi-cured product may be, for example, 5% or more, 15% or more, 30% or more, or 40% or more. When the curing ratio of the semi-cured product is within the above range, the semi-cured product may be prevented from flowing out of the resin composite, and the semi-cured product may be sufficiently held in the pores of the nitride sintered body.

The curing ratio can be determined by measurement using a differential scanning calorimeter. First, measured is a heat quantity Q, which is generated when 1 g of the thermosetting composition in an uncured state is completely cured. Next, 1 g of a semi-cured product is collected from the composite to be measured, and a heat quantity R generated when the collected semi-cured product is completely cured is measured. For the measurement, a differential scanning calorimeter is used. Thereafter, the curing ratio of the semi-cured product can be calculated according to the following equation (A). Whether the semi-cured product is completely cured or not can be confirmed with the end of exotherm on an exothermic curve obtained by differential scanning calorimetry.

Curing ratio of semi-cured product[%]=[$(Q-R)/R$]×100    (A)

The curing ratio may be calculated also as follows. That is, the curing ratio of the semi-cured product impregnated into the nitride sintered body can be determined by the following method. First, an amount of heat generation Q2 generated when the uncured thermosetting composition is completely cured by heating the composition is determined. Then, determined is an amount of heat generation R2 generated when the sample collected from the semi-cured product included in the composite is completely cured by heated the sample in the same manner. At this time, the mass of the sample used for the measurement with the differential scanning calorimeter is equivalent to that of the thermosetting composition used for the measurement of the amount of heat generation Q2. When c (% by mass) of the component having thermosetting properties is contained in the semi-cured product, the curing ratio of the thermosetting composition impregnated into the composite can be determined by the following equation (B).

Curing ratio of semi-cured product impregnated (%)={1−[($R2/c$)×100]/$Q2$}×100    (B)

The content of the semi-cured product may be, for example, 20% by volume or more, 25% by volume or more, 30% by volume or more, 35% by volume or more, or 40% by volume or more based on the composite. When the content of the thermosetting composition is within the above range, adhesiveness on adhesion to the adherend by means of heating and pressing may be further improved. The content of the thermosetting composition may be, for example, 70% by volume or less, 65% by volume or less, 60% by volume or less, or 55% by volume or less based on the composite. When the content of the thermosetting composition is within the above range, both the adhesiveness and insulating properties of the composite may be achieved at a higher level. The content of the thermosetting composition can be adjusted within the above range and may be, for example, from 20 to 70% by volume. The content of the semi-cured product is obtained by heating the resin composite at about 600° C. to volatilize the semi-cured product and measuring the difference of the weights before and after the volatilization.

The content of the thermosetting composition in the composite described above can be regarded as the porosity of the nitride sintered body and can be calculated from the following equation (C). The true density of the nitride sintered body is, for example, 2.28 g/cm$^3$ in the case of boron nitride.

Content of thermosetting composition[% by volume]=porosity of nitride sintered body=[1−($D$/true density of nitride sintered body)]    (C)

In the above equation (C), D means the bulk density of the nitride sintered body represented by the following equation (D).

Bulk density of nitride sintered body [g/cm$^3$]=mass of nitride sintered body/volume of nitride sintered body    (D)

In the above equation (C), when the nitride sintered body is obtained from a plurality of nitrides, the true density of the nitride sintered body means a value calculated by multiplying the true density of each of the nitrides at the compounding ratio (mass ratio) of each of the nitrides. For example, when a nitride A and a nitride B are mixed at a mass ratio of a:b, the true density of the nitride sintered body is determined by the following equation (D).

$$\text{True density of nitride sintered body [g/cm}^3\text{]}=(A\times a+B\times b)\div(a+b) \quad (D)$$

The above-described composite sheet 10 can be produced, for example, by the following production method. One embodiment of the method for producing a composite sheet has cutting a resin-impregnated body comprising a nitride sintered body having a porous structure and a semi-cured product of a thermosetting resin composition impregnated into the nitride sintered body by use of a wire saw under conditions including a wire reciprocating linear speed of 155 to 1000 mm/min and a table moving speed of 4 mm/min or less, to obtain a composite sheet. According to the method for producing the composite sheet, the line roughness Rz (maximum height), specified by JIS B 0601: 2013, on at least one of the principal surfaces of the composite sheet, may be 10 μm or less.

As the resin-impregnated body comprising a nitride sintered body having a porous structure and the semi-cured product of the thermosetting resin composition impregnated into the nitride sintered body, one prepared in advance may be used or one may be separately prepared and used. The method for preparing a resin-impregnated body has, for example, impregnating a nitride sintered body having a porous structure with a thermosetting composition (hereinafter, also referred to as impregnation), and heating the thermosetting composition to a heating temperature of 80 to 130° C. to semi-cure the thermosetting composition (hereinafter, also referred to as semi-curing). The impregnation may be impregnating a nitride sintered body with a thermosetting composition while the temperature of the thermosetting composition is set to a temperature higher than the heating temperature in the semi-curing and equal to or lower than the heating temperature+20° C.

The nitride sintered body having a porous structure may be formed by sintering primary particles of the nitride. As the nitride sintered body having a porous structure, a commercially available nitride sintered body may be used, or one prepared by sintering a nitride-containing powder may be used. That is, the method for preparing a resin-impregnated body may further has sintering a nitride-containing powder (hereinafter, also referred to as a nitride powder) to obtain a nitride sintered body having a porous structure. The nitride sintered body may be prepared by spheroidizing a slurry containing a nitride powder with a spray dryer or the like, further molding the slurry, and then sintering the molded slurry to prepare a nitride sintered body having a porous structure. For the molding, a mold may be used, or a cold isostatic pressing (CIP) method may be used.

The nitride may contain, for example, at least one nitride selected from the group consisting of boron nitride, aluminum nitride, and silicon nitride, and preferably contains boron nitride. As the boron nitride, either amorphous boron nitride or hexagonal boron nitride can be used. The thermal conductivity of the nitride may be, for example, 40 W/(m·K) or more, 50 W/(m·K) or more, or 60 W/(m·K) or more. When the nitride having excellent thermal conductivity as described above is used as the nitride, the thermal resistance of a resin-impregnated body to be obtained and a composite sheet to be cut out from the resin-impregnated body may be further reduced.

When the nitride powder is sintered, a sintering aid may be used. The sintering aid may be, for example, an oxide of a rare earth element such as yttria oxide, alumina oxide, and magnesium oxide, a carbonate of an alkali metal such as lithium carbonate and sodium carbonate, and boric acid. In the case of compounding a sintering aid, the amount of the sintering aid added may be, for example, 0.01 parts by mass or more, or 0.1 parts by mass or more with respect to 100 parts by mass of the total of the nitride and the sintering aid. The amount of the sintering aid added may be, for example, 20 parts by mass or less, 15 parts by mass or less, or 10 parts by mass or less with respect to 100 parts by mass of the total of the nitride and the sintering aid. When the amount of the sintering aid added is set within the above range, the average pore size of the nitride sintered body may easily adjusted to the above range.

The sintering temperature of the nitride may be, for example, 1600° C. or higher, or 1700° C. or higher. The sintering temperature of the nitride may be, for example, 2200° C. or lower, or 2000° C. or lower. The sintering time of the nitride may be, for example, 1 hour or more and 30 hours or less. The atmosphere during sintering may be, for example, an inert gas atmosphere such as nitrogen, helium, and argon.

For sintering, for example, a batch furnace, a continuous furnace, or the like can be used. Examples of the batch furnace include a muffle furnace, a tubular furnace, and an atmosphere furnace. Examples of the continuous furnace include a rotary kiln, a screw conveyor furnace, a tunnel furnace, a belt furnace, a pusher furnace, and a koto (Japanese harp)-shaped continuous furnace.

In the impregnation, a solution including the thermosetting composition is provided in an impregnation apparatus, and the nitride sintered body is immersed in the solution to impregnate the pores of the nitride sintered body with the thermosetting composition. The solution including the thermosetting composition may include a solvent in addition to the thermosetting composition, or may contain only the thermosetting composition. Examples of the solvent include aliphatic alcohols, ether alcohols, glycol ethers, ketones, and hydrocarbons.

The thermosetting composition contains at least one compound selected from the group consisting of a compound having a cyanate group, a compound having a bismaleimide group, and a compound having an epoxy group, and at least one curing agent selected from the group consisting of a phosphine-based curing agent and an imidazole-based curing agent.

Examples of the compound having a cyanate group include dimethylmethylenebis(1,4-phenylene)biscyanate and bis(4-cyanatophenyl)methane. Dimethylmethylenebis (1,4-phenylene)biscyanate is commercially available, for example, as TACN (manufactured by MITSUBISHI GAS CHEMICAL COMPANY, INC., trade name).

Examples of the compound having a bismaleimide group include N,N'-[(1-methylethylidene)bis[(p-phenylene)oxy(p-phenylene)]]bismaleimide and 4,4'-diphenylmethanebismaleimide.

N,N'-[(1-Methylethylidene)bis[(p-phenylene)oxy(p-phenylene)]]bismaleimide is commercially available, for example, as BMI-80 (manufactured by K.I Chemical Industry Co., Ltd., trade name).

Examples of the compound having an epoxy group include 1,6-bis(2,3-epoxypropan-1-yloxy)naphthalene and a compound represented by the following general formula (3). In the general formula (3), the value of n is not particularly limited but may be set to an integer of 0 or 1 or greater, and is usually 1 to 10, and preferably 2 to 5. 1,6-Bis(2,3-epoxypropan-1-yloxy)naphthalene is commercially available, for example, as HP-4032D (manufactured by DIC Corporation, trade name).

[Formula 3]

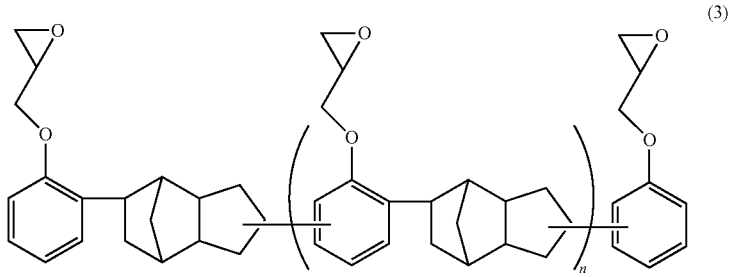

(3)

In the thermosetting composition, the total amount of the compound having a cyanate group, the compound having a bismaleimide group, and the compound having an epoxy group may be 50% by mass or more, 70% by mass or more, 80% by mass or more, or 90% by mass or more, based on the total amount of the thermosetting composition.

The content of the compound having a cyanate group in the thermosetting composition may be, for example, 50 parts by mass or more, 60 parts by mass or more, or 70 parts by mass or more with respect to 100 parts by mass of the total amount of the compound having a cyanate group and the compound having a bismaleimide group. When the content of the compound having a cyanate group in the thermosetting composition is within the above range, the curing reaction on adhesion of a composite sheet cut out from a resin-impregnated body to be obtained to an adherend including a metal substrate rapidly proceeds, and the insulating properties after adhesion to the adherend may be further improved.

The content of the compound having a bismaleimide group in the thermosetting composition may be, for example, 15 parts by mass or more, 20 parts by mass or more, or 25 parts by mass or more with respect to 100 parts by mass of the total amount of the compound having a cyanate group and the compound having a bismaleimide group. When the content of the compound having a bismaleimide group in the thermosetting composition is within the above range, the water absorption rate of the semi-cured product decreases, and the reliability of the product may be improved.

The content of the compound having an epoxy group in the thermosetting composition may be, for example, 10 parts by mass or more, 20 parts by mass or more, or 30 parts by mass or more with respect to 100 parts by mass of the total amount of the compound having a cyanate group and the compound having a bismaleimide group. The content of the compound having an epoxy group in the thermosetting composition may be, for example, 70 parts by mass or less or 60 parts by mass or less with respect to 100 parts by mass of the total amount of the compound having a cyanate group and the compound having a bismaleimide group. When the content of the compound having an epoxy group in the thermosetting composition is within the above range, a decrease in the thermosetting initiation temperature of the thermosetting composition may be suppressed, and the nitride sintered body is more easily impregnated with the thermosetting composition.

The curing agent may contain a phosphine-based curing agent and an imidazole-based curing agent.

The phosphine-based curing agent may accelerate a triazine formation reaction by trimerization of a compound having a cyanate group or a cyanate resin. Examples of the phosphine-based curing agent include tetraphenylphosphonium tetra-p-tolylborate, and tetraphenylphosphonium tetraphenylborate. Tetraphenylphosphonium tetra-p-tolylborate is commercially available, for example, as TPP-MK (manufactured by HOKKO CHEMICAL INDUSTRY CO., LTD., trade name).

The imidazole-based curing agent generates oxazoline and accelerates the curing reaction of a compound having an epoxy group or an epoxy resin. Examples of the imidazole-based curing agent include 1-(1-cyanomethyl)-2 ethyl-4 methyl-1H-imidazole, and 2-ethyl-4-methylimidazole. 1-(1-Cyanomethyl)-2-ethyl-4 methyl-1H-imidazole is commercially available, for example, as 2E4MZ-CN (manufactured by SHIKOKU CHEMICALS CORPORATION, trade name).

The content of the phosphine-based curing agent may be, for example, 5 parts by mass or less, 4 parts by mass or less, or 3 parts by mass or less with respect to 100 parts by mass of the total amount of the compound having a cyanate group, the compound having a bismaleimide group, and the compound having an epoxy group. The content of the phosphine-based curing agent may be, for example, 0.1 parts by mass or more or 0.5 parts by mass or more with respect to 100 parts by mass of the total amount of the compound having a cyanate group, the compound having a bismaleimide group, and the compound having an epoxy group. When the content of the phosphine-based curing agent is within the above range, the resin-impregnated body is easily prepared, and the time required for adhesion of the composite sheet cut out from the resin-impregnated body to the adherend may be further shortened.

The content of the imidazole-based curing agent may be, for example, 0.1 parts by mass or less, 0.05 parts by mass or less, or 0.03 parts by mass or less with respect to 100 parts by mass of the total amount of the compound having a cyanate group, the compound having a bismaleimide group, and the compound having an epoxy group. The content of the imidazole-based curing agent may be, for example, 0.001 parts by mass or more or 0.005 parts by mass or more with respect to 100 parts by mass of the total amount of the compound having a cyanate group, the compound having a bismaleimide group, and the compound having an epoxy group. When the content of the imidazole-based curing agent is within the above range, the resin-impregnated body is easily prepared, and the time required for adhesion of the composite sheet cut out from the resin-impregnated body to the adherend used may be further shortened.

The thermosetting composition may contain other components other than the compound having a cyanate group, the compound having a bismaleimide group, the compound having an epoxy group, and the curing agent. As the other components, for example, other resins such as a phenol resin, a melamine resin, a urea resin, and an alkyd resin, a silane coupling agent, a leveling agent, an antifoaming agent, a surface adjusting agent, and a wet dispersant may be further included. The content of these other components may be, for example, 20% by mass or less, 10% by mass or less, or 5% by mass or less, based on the total amount of the thermosetting composition.

The viscosity of the solution containing the thermosetting composition at 100° C. may be, for example, 50 mPa·s or less, 30 mPa·s or less, 20 mPa·s or less, 10 mPa·s or less, or 5 mPa·s. When the viscosity of the solution at 150° C. is within the above range, the resin-impregnated body is more easily prepared. The viscosity of the solution at 100° C. may be 3 mPa·s or more. The viscosity of the solution at 100° C. is preferably maintained to be 50 mPa·s or less for 5 hours or more in a state in which the temperature of the solution is maintained at 100° C. The viscosity of the solution at 100° C. means a value measured using a rotary viscometer under conditions of a shear rate of 10 (1/second).

The impregnation may be conducted either under reduced pressure conditions or under pressurized conditions, or may be conducted by combining impregnation under reduced pressure conditions and impregnation under pressurized conditions. The pressure in the impregnation apparatus when the impregnation is conducted under reduced pressure conditions may be, for example, 1000 Pa or less, 500 Pa or less, 100 Pa or less, 50 Pa or less, or 20 Pa or less. The pressure in the impregnation apparatus when the impregnation is conducted under pressurized conditions may be, for example, 1 MPa or more, 3 MPa or more, 10 MPa or more, or 30 MPa or more.

In the impregnation, a solution containing the thermosetting composition is heated. When the solution is heated in the following temperature range, the viscosity of the solution is adjusted, impregnation of the resin is promoted, and thus an excellent resin-impregnated body is obtained. The temperature at which the solution is heated is higher than the heating temperature for semi-curing. The upper limit of the temperature for heating the solution is equal to or lower than the heating temperature for semi-curing+20° C.

In the impregnation, the nitride sintered body in a state of being immersed in the solution containing the thermosetting composition is maintained for a predetermined time. The predetermined time may be, for example, 5 hours or more, 10 hours or more, 100 hours, or 150 hours or more.

The semi-curing is heating the thermosetting composition impregnated into the nitride sintered body to semi-cure the thermosetting composition. The semi-cured state of the thermosetting composition in the resin-impregnated body can be adjusted via the semi-curing. The heating temperature at this time is from 80 to 130° C.

The semi-cured product to be obtained by the semi-curing may contain at least one thermosetting resin selected from the group consisting of a cyanate resin, a bismaleimide resin, and an epoxy resin, and a curing agent. In addition to the thermosetting resin and the curing agent described above, the semi-cured product may contain other resins such as a phenol resin, a melamine resin, a urea resin, and an alkyd resin, and components derived from a silane coupling agent, a leveling agent, an antifoaming agent, a surface adjusting agent, a wet dispersant, and the like. The total content of the other resins and the components may be, for example, 20% by mass or less, 10% by mass or less, or 5% by mass or less, based on the total amount of the semi-cured product.

Figure 3:
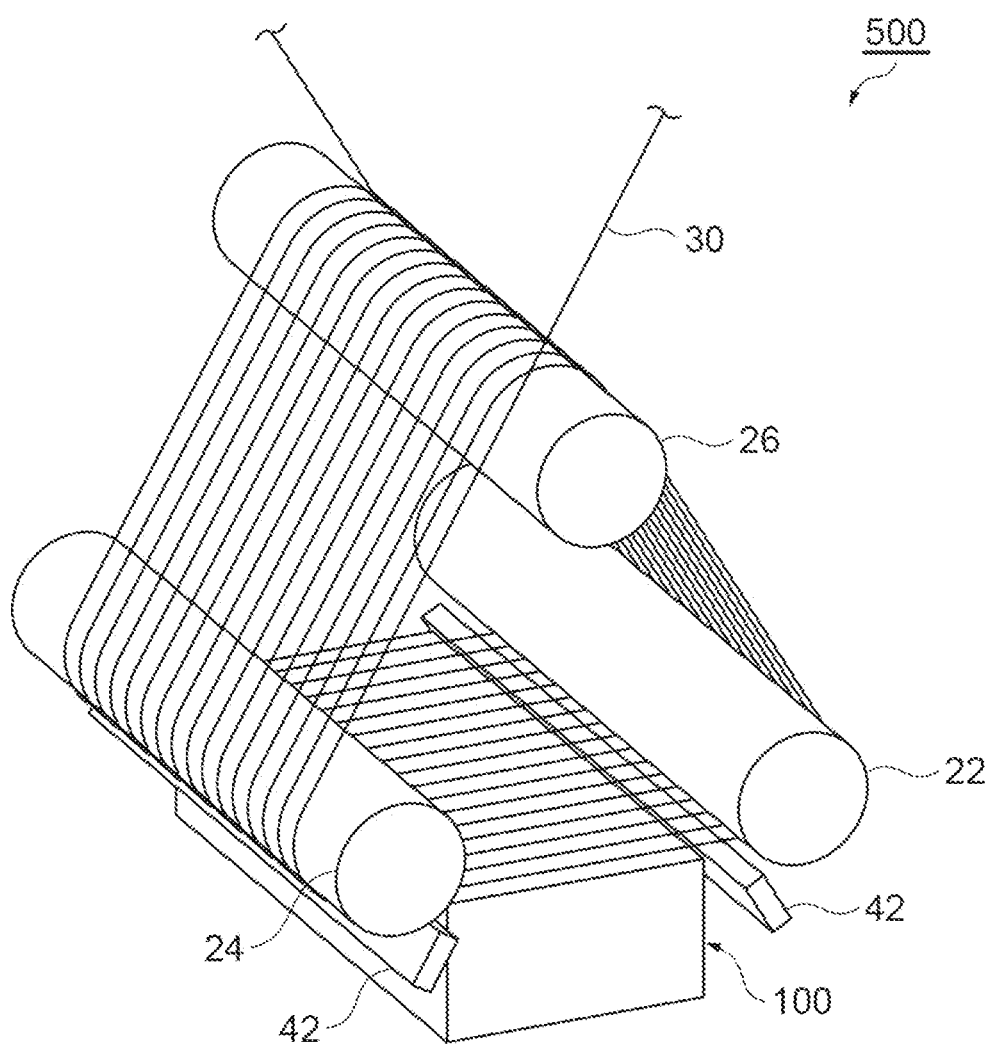
FIG. 3 is a schematic view illustrating an example of a method for producing composite sheets.

The composite sheet can be prepared by cutting the resin-impregnated body described above with a wire saw (e.g., a multi-cut wire saw or the like). FIG. 3 is a schematic view illustrating an example of a method for producing composite sheets. FIG. 3 is a schematic view of an apparatus configuration when the resin-impregnated body 100 is cut with a multi-cut wire saw 500 to prepare composite sheets. The multi-cut wire saw 500 includes a first roller 22, a second roller 24, and a third roller 26, a wire 30 supported by the three rollers described above, and a supply nozzle 42 that supplies a slurry abrasive liquid to the wire 30. The wire 30, supported by the first roller 22, the second roller 24, and the third roller 26, moves at a predetermined reciprocating speed, coated with the abrasive liquid supplied from the supply nozzle 42, and gradually cut the resin-impregnated body 100. The resin-impregnated body 100 is disposed on a movable table (not illustrated), and is pushed up by the table that gradually rises in accordance with cutting by the wire 30. As a result, the resin-impregnated body 100 is cut to prepare a plurality of composite sheets.

The lower limit value of the wire reciprocating linear speed of the wire saw is 155 mm/min or more, and may be, for example, 200 mm/min or more, 300 mm/min or more, 400 mm/min or more, or 500 mm/min or more. When the lower limit value of the wire reciprocating linear speed is set within the above range, occurrence of wire breakage, deflection of the wire, and the like can be suppressed, and the resin-impregnated body may be cut more stably. The upper limit value of the wire reciprocating linear speed of the wire saw is 1000 mm/min or less, and may be, for example, 950 mm/min or less, 900 mm/min or less, 800 mm/min or less, 700 mm/min or less, or 600 mm/min or less. Setting the upper limit value of the wire reciprocating linear speed within the above range enables the line roughness Rz and the arithmetic average roughness Ra on the principal surface of the composite sheet to be obtained to be smaller. The wire reciprocating linear speed can be adjusted within the above range, and may be, for example, from 155 to 1000 mm/min or from 400 to 900 mm/min.

The table moving speed of the wire saw is related to the penetration speed of the wire saw into the resin-impregnated body to be cut by the wire saw. The upper limit value of the table moving speed of the wire saw is 4 mm/min or less, and may be, for example, 3 mm/min or less, 2 mm/min or less, or 1.5 mm/min or less. Setting the table moving speed within the above range enables the linear roughness Rz and the arithmetic average roughness Ra on the principal surface of a composite sheet to be obtained to be smaller. The lower limit value of the table moving speed of the wire saw may be, for example, 0.1 mm/min or more, 0.3 mm/min or more, or 0.5 mm/min or more. Setting the lower limit value of the table moving speed of the wire saw within the above range enables the linear roughness Rz and the arithmetic average roughness Ra on the principal surface of a composite sheet to be obtained to be smaller as well as enables the productivity to be maintained at a high level. The table moving speed may be adjusted within the range described above in relation to the wire reciprocating linear speed or the like, and may be, for example, from 0.5 to 4 mm/min or from 0.5 to 2 mm/min.

The size of the resin-impregnated body may be adjusted before cutting with a wire saw. The lower limit of the width of the resin-impregnated body may be, for example, 5 mm or more, 10 mm or more, or 50 mm or more. Setting the lower limit value of the width within the above range enables generation of vibration of the resin-impregnated body on cutting to be suppressed and enables the line roughness Rz and the arithmetic average roughness Ra to be smaller. The upper limit value of the width of the resin-impregnated body may be, for example, 150 mm or less, 120 mm or less, or 110 mm or less. Setting the upper limit value of the width within the above range enables the contact distance between the resin-impregnated body and the wire to be reduced and enables the line roughness Rz and the arithmetic average roughness Ra on the principal surface of a composite sheet to be obtained to be smaller. The width of the resin-impregnated body can be adjusted within the above range, and may be, for example, from 5 to 150 mm.

The composite sheet described above can be used, for example, for producing a laminate such as a thermally conductive adhesive sheet. An embodiment of the laminate includes a first metal substrate, an intermediate layer provided on the first metal substrate, and a second metal substrate provided on a side of the intermediate layer opposite to the first metal substrate. Here, the first metal substrate and the second metal substrate are connected via the intermediate layer, and the intermediate layer corresponds to the cured product of the composite sheet described above.

Figure 4:
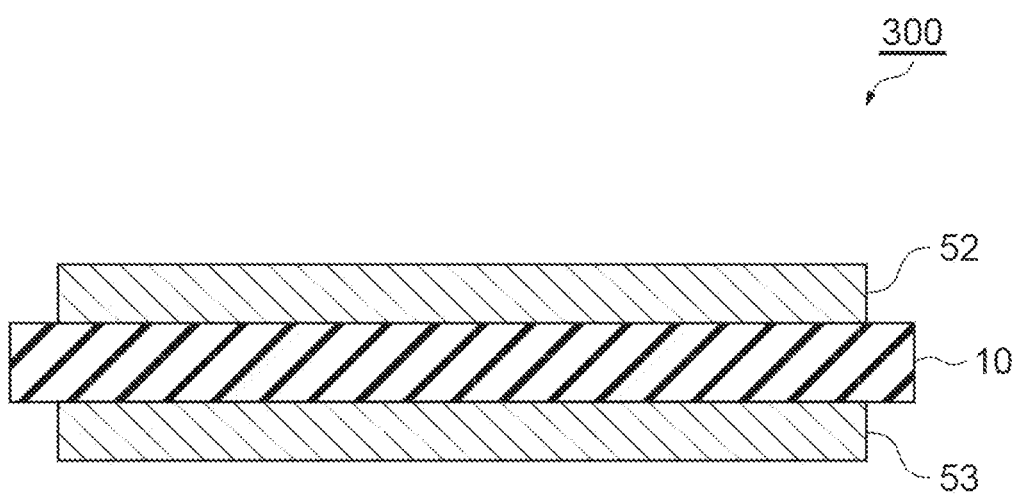
FIG. 4 is a schematic cross-sectional view illustrating an example of a laminate.

FIG. 4 is a schematic cross-sectional view illustrating an example of a laminate. A laminate 300 includes the composite sheet 10 described above, a first metal substrate 52 provided on one principal surface of the composite sheet 10, and a second metal substrate 53 provided on the other principal surface of the composite sheet 10.

The thicknesses of the first metal substrate 52 and the second metal substrate 53 may be, independently of each other, for example, 0.035 mm or more or 10 mm or less. The first metal substrate 52 and the second metal substrate 53 may form, for example, a circuit.

The first metal substrate 52 and the second metal substrate 53 may be the same metal substrates or may be different metal substrates. The first metal substrate 52 and the second metal substrate 53 may contain, for example, at least one selected from the group consisting of copper and aluminum, and may be copper or aluminum. The first metal substrate 52 and the second metal substrate 53 may contain a metal other than copper and aluminum.

Figure 5:
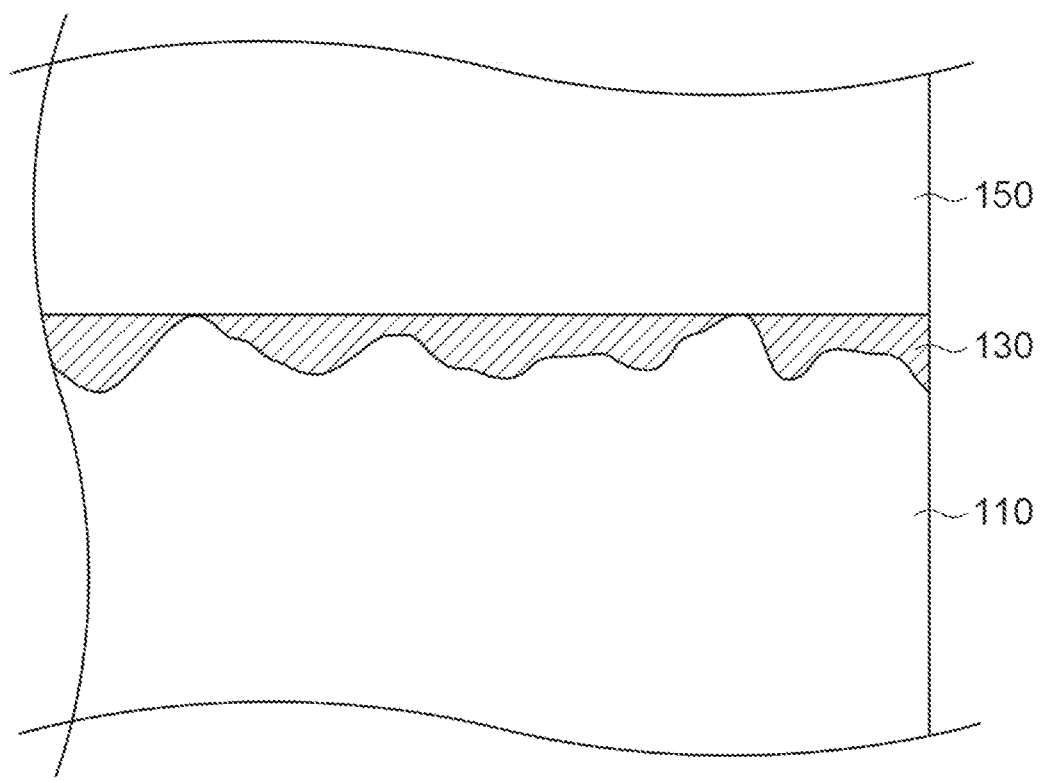
FIG. 5 is a partial cross-sectional view of a laminate obtained using a conventional composite sheet.

In the case of a conventional composite sheet, the heat dissipation properties of the laminate may vary due to a large Rz or the like of the principal surface of the composite sheet. This is presumed to be caused by the fact that, in the case of lamination with the metal substrate, at the interface between the metal substrate and the principal surface of the composite sheet, the thickness of the resin layer, which is a cured product of the thermosetting resin composition derived from the composite sheet, varies in the in-plane direction of the interface. FIG. 5 is a partial cross-sectional view of a laminate obtained using a conventional composite sheet. As shown in FIG. 5, since Rz and the like on the principal surface of the conventional composite sheet 110 are large, a resin layer 130 having thicknesses different from point to point is present at the interface between the conventional composite sheet 110 and a metal substrate 150. The present inventors presume that variations occur in the diffusion of heat for this reason.

In the laminate of the present disclosure, which comprises the composite sheet 10 described above, there are suppressed variations in heat dissipation properties in the in-plane direction of the interface between the composite sheet 10 and at least one of the first metal substrate 52 and the second metal substrate 53. This is because the thickness difference of the resin layer derived from the composite sheet 10 is reduced.

The laminate described above can be produced, for example, by the following method. One embodiment of the method for producing a laminate includes disposing and laminating each of a first metal substrate and a second metal substrate so as to face a pair of principal surfaces of the composite sheet, heating the first metal substrate and the second metal substrate while the first metal substrate and the second metal substrate are pressurized in a laminating direction to cure the thermosetting resin composition, thereby connecting the composite sheet with the first metal substrate and the second metal substrate.

In the method for producing a laminate, the composite described above is employed, and thus adhesion between the first metal substrate and the second metal substrate may be achieved in a short time. The adhesion time can be 2 hours or less, 1 hour or less, or 0.5 hours or less.

Some embodiments have been described above, and, to common configurations, the description of each of the configurations can be applied. Further, the present disclosure is not limited to the embodiments in any way.

EXAMPLES

The contents of the present disclosure will be described in more detail with reference to Examples and Comparative Examples, but the present disclosure is not limited to the following Examples.

Example 1

[Preparation of Boron Nitride Sintered Body]

40.0% by mass of an amorphous boron nitride powder (manufactured by Denka Company Limited, oxygen content: 1.5%, boron nitride purity: 97.6%, average particle size: 6.0 μm) and 60.0% by mass of a hexagonal boron nitride powder (manufactured by Denka Co., Ltd., oxygen content: 0.3%, boron nitride purity: 99.0%, average particle size: 30.0 μm) were each measured into a container, a sintering aid (boric acid, calcium carbonate) was added thereto, subsequently an organic binder and water were added and mixed therein, and then the mixture was dried and granulated to prepare a mixed powder of nitrides.

The mixed powder was charged into a cold isostatic pressing (CIP) apparatus (manufactured by Kobe Steel, Ltd., trade name: ADW800), and the mixed powder was compressed by applying a pressure of 20 to 100 MPa to obtain a molded body. The molded body obtained was sintered by maintaining the molded body at 2000° C. for 10 hours using a batch type high frequency furnace (manufactured by Fuji Dempa Kogyo Co., Ltd., trade name: FTH-300-1H) to prepare a nitride sintered body. Incidentally, calcination was conducted by adjusting the inside of the furnace under a nitrogen atmosphere while causing nitrogen to flow into the furnace in a standard state at a flow rate of 10 L/min. The boron nitride sintered body obtained had an average pore size of 5 μm and a porosity of 50% by volume.

<Measurement of Average Pore Size>

The boron nitride sintered body obtained was measured for the pore size distribution (horizontal axis:pore size, vertical axis:cumulative pore volume) using a mercury porosimeter (manufactured by Shimadzu Corporation) when the sintered body was pressurized with a pressure increasing from 0.03 atm to 4000 atm. From the pore size distribution, the average pore size was calculated as the pore size at which the cumulative pore volume reached 50% of the total pore volume.

<Measurement of Porosity>

The volume and mass of the boron nitride sintered body obtained were measured, and the bulk density (D; g/cm$^3$) was calculated from the volume and mass. From this bulk density and the theoretical density of boron nitride (2.28 g/cm$^3$), the porosity was calculated according to the following formula.

Porosity (% by volume)=[1−(D/2.28)]×100

[Impregnation with Resin Composition]

80 parts by mass of a compound having a cyanate group, 20 parts by mass of a compound having a bismaleimide group, and 50 parts by mass of a compound having an epoxy group were measured into a container, and 1 part by mass of a phosphine-based curing agent and 0.01 parts by mass of an imidazole-based curing agent were added and mixed with respect to 100 parts by mass of the total amount of the three kinds of compounds to prepare a thermosetting composition. Since the epoxy resin was in a solid state at room temperature, the mixture was mixed in a state of being heated to about 80° C. The viscosity at 100° C. of the thermosetting composition obtained was 10 mPa·s.

The following compounds were used for the preparation of the thermosetting composition.

<Compound Having Specific Functional Group>

Compound having a cyanate group: Dimethylmethylenebis(1,4-phenylene)biscyanate (manufactured by MITSUBISHI GAS CHEMICAL COMPANY, INC., trade name: TA-CN)

Compound having a bismaleimide group: N,N'-[(1-Methylethylidene)bis[(p-phenylene)oxy(p-phenylene)]]bismaleimide (manufactured by K.I Chemical Industry Co., Ltd., trade name: BMI-80) Compound having an epoxy group: 1,6-Bis(2,3-epoxypropan-1-yloxy)naphthalene (manufactured by DIC Corporation, trade name: HP-4032D)

Compound having a benzoxazine group: Bisphenol F type benzoxazine (manufactured by SHIKOKU CHEMICALS CORPORATION, trade name: F-a type benzoxazine)

<Curing Agent>

Phosphine-based curing agent: Tetraphenylphosphonium tetra-p-tolylborate (manufactured by CHEMICAL INDUSTRY CO., LTD., trade name: TPP-MK)

Imidazole-based curing agent: 1-(1-Cyanomethyl)-2-ethyl-4-methyl-1H-imidazole (manufactured by SHIKOKU CHEMICALS CORPORATION, trade name: 2E4MZ-CN)

Metal catalyst: Bis(2,4-pentanedionato)zinc(II) (Tokyo Chemical Industry Co., Ltd.)

The nitride sintered body prepared as described above was impregnated with the thermosetting composition prepared as described above, by the following method. First, the nitride sintered body and the thermosetting composition contained in a container were placed in a vacuum heating impregnation apparatus (manufactured by KYOSIN ENGINEERING CORPORATION, trade name: G-555AT-R). Next, the inside of the apparatus was degassed for 10 minutes under conditions of a temperature of 100° C. and a pressure of 15 Pa. After degassing, the nitride sintered body was immersed in the thermosetting composition for 40 minutes, while being maintained under the same conditions, to impregnate the nitride sintered body with the thermosetting composition.

Thereafter, the container containing the nitride sintered body and the thermosetting composition was taken out, placed in a pressure heating impregnation apparatus (manufactured by KYOSIN ENGINEERING CORPORATION, trade name: HP-4030AA-H45), and maintained for 120 minutes under conditions of a temperature of 130° C. and a pressure of 3.5 MPa to thereby impregnate the nitride sintered body with the thermosetting composition. Thereafter, the nitride sintered body was taken out from the apparatus and heated under conditions of a temperature of 120° C. and atmospheric pressure for 8 hours to semi-cure the thermosetting composition, and thereby a boron nitride sintered body (resin-impregnated body) filled with the resin was prepared. The content of the semi-cured product in the resin-impregnated body obtained was 50% by volume. The size of the resin-impregnated body of the obtained composite body was 50 mm in length (length), 50 mm in width (width), and 50 mm in height (thickness).

<Measurement of Content of Resin (Semi-Cured Product)>

The content of the resin in the composite obtained was measured by the following procedure. The content (% by volume) of the resin in the resin-impregnated body was determined by measuring the bulk density of the boron nitride sintered body and the bulk density of the composite shown below.

Content of resin in resin-impregnated body (%)= ((resin-impregnated body bulk density−boron nitride sintered body bulk density)/(composite theoretical density−boron nitride sintered body bulk density))×100

The composite theoretical density was determined by the following equation.

Composite theoretical density boron nitride true density+resin true density×(1−boron nitride sintered body bulk density/boron nitride true density)

The bulk density of the boron nitride sintered body and the resin-impregnated body was determined in accordance with "Method for Measuring Density and Specific Gravity by Geometric Measurement" in JIS Z 8807:2012, based on the volume calculated from the length of each side (measured with a caliper) of the regular hexahedron-shaped boron nitride sintered body or the composite and the mass of the boron nitride sintered body or the composite weighed with an electronic balance (see Section 9 of JIS Z 8807:2012). The true density of the boron nitride sintered body and the resin was calculated from the volume and mass of the boron nitride sintered body and the resin measured using a dry automatic densitometer in accordance with "Method for Measuring Density and Specific Gravity by Gas Displacement Method" in JIS Z 8807:2012 (see Equations (14) to (17) of Section 11 in JIS Z 8807:2012).

[Preparation of Composite Sheet: Cutting of Resin-Impregnated Body into Composite Sheet]

The resin-impregnated body prepared as described above was placed on the table of a multi-cut wire saw and prepared into a plurality of composite sheets by the multi-cut wire saw under the conditions described in Table 1. The conditions of the multi-cut wire saw were prepared as described in Table 1. In Table 1, the wire reciprocating linear speed (unit: mm/s) is the operation speed of the wire, the table moving speed (unit: mm/s) is the rising speed of the table, and the sample width (unit: mm) is the width of the resin-impregnated body to be cut. The composite sheets obtained each had a thickness of 0.40 mm.

Comparative Example 1

Composite sheets were prepared in the same manner as in Example 1 except that the wire reciprocating linear speed of the multi-cut wire saw was changed to 150 mm/s. The composite sheets obtained each had a thickness of 0.41 mm.

<Evaluation of Composite Sheet 1: Line Roughness Rz (Maximum Height) and Arithmetic Average Roughness Ra>

For the composite sheets obtained in Example 1 and Comparative Example 1, the line roughness Rz and the arithmetic average roughness Ra of the processed surface (cut surface by the multi-cut wire) were measured. The line roughness Rz and the arithmetic average roughness Ra were measured in accordance with the description of JIS B0601: 2013 "Geometrical Product Specifications (GPS)—Surface texture: Profile method-Terms, definitions and surface texture parameters". The results are shown in Table 1.

<Evaluation 2 of Composite Sheet: Thermal Resistance and Heat Dissipation Properties>

The composite sheet obtained in each of Example 1 and Comparative Example 1 was placed between two copper plates, heated and pressurized under conditions of 200° C. and 10 MPa for 5 minutes, and further heated under conditions of 200° C. and atmospheric pressure for 2 hours to prepare a laminate, which was used as an object to be measured. The thermal resistance was measured in accordance with to ASTM-D 5470. The thermal resistance of the laminate prepared using the composite sheet obtained in Example 1 was evaluated based on the thermal resistance (unit: K/W) of the laminate prepared using the composite sheet obtained in Comparative Example 1. In addition, the heat dissipation properties of the laminate was evaluated according to the following criteria. The results are shown in Table 1.

A: The thermal resistance is less than 0.8 when the value in Comparative Example 1 is taken as 1.

B: The thermal resistance is 0.8 or more and less than 1 when the value in Comparative Example 1 is taken as 1.

C: Thermal resistance is 1 or more when the value in Comparative Example 1 is taken as 1.

TABLE 1

| | | Example 1 | Comparative Example 1 |
|---|---|---|---|
| Conditions of multi-cut wire saw | Wire reciprocating linear speed [mm/s] | 300 | 150 |
| | Table moving speed [mm/s] | 0.5 | 0.5 |
| | Sample width [mm] | 50 | 50 |
| Evaluation | Cuttability | A | A |
| | Line roughness Rz [μm] | 4.0 | 12 |
| | Arithmetic average roughness Ra [μm] | 0.7 | 2.5 |
| | Thermal resistance | 0.7 | 1 |
| | Heat dissipation properties | A | C |

In the item of cuttability in Table 1, the case in which the composite was able to be cut from the resin-impregnated body into sheets (the case in which the composite sheet was able to be prepared) was indicated by "A", and the case in which the composite could not be cut from the resin-impregnated body into sheets (the case in which the composite sheets was not able to be prepared) was indicated by "B". The same applies to Table 2 and Table 3.

Example 2

Composite sheets were prepared in the same manner as in Example 1 except that the wire reciprocating linear speed of the multi-cut wire saw was changed to 900 mm/s. The composite sheets obtained each had a thickness of 0.41 mm. The composite sheet obtained was subjected to measurement of the line roughness Rz (maximum height) and arithmetic average roughness Ra, and evaluation of the thermal resistance and heat dissipation properties. The results are shown in Table 2.

Example 3

Composites sheet were prepared in the same manner as in Example 1 except that the wire reciprocating linear speed of the multi-cut wire saw was changed to 500 mm/s and the table moving speed was changed to 0.1 mm/s. The composite sheets obtained each had a thickness of 0.39 mm. The composite sheet obtained was subjected to measurement of the line roughness Rz (maximum height) and arithmetic average roughness Ra, and evaluation of the thermal resistance and heat dissipation properties. The results are shown in Table 2.

Example 3

Composite sheets were prepared in the same manner as in Example 1 except that the wire reciprocating linear speed of the multi-cut wire saw was changed to 500 mm/s and the table moving speed was changed to 2 mm/s. The composite sheets obtained each had a thickness of 0.40 mm. The composite sheet obtained was subjected to measurement of the line roughness Rz (maximum height) and arithmetic average roughness Ra, and evaluation of the thermal resistance and heat dissipation properties. The results are shown in Table 2.

Example 4

Composite sheets were prepared in the same manner as in Example 1 except that the wire reciprocating linear speed of the multi-cut wire saw was changed to 500 mm/s and the sample width was changed to 10 mm. The composite sheets obtained each had a thickness of 0.41 mm. The composite sheet obtained was subjected to measurement of the line roughness Rz (maximum height) and arithmetic average roughness Ra, and evaluation of the thermal resistance and heat dissipation properties. The results are shown in Table 2.

Example 2

Composite sheets were prepared in the same manner as in Example 1 except that the wire reciprocating linear speed of the multi-cut wire saw was changed to 500 mm/s and the sample width was changed to 120 mm. The composite sheets obtained each had a thickness of 0.40 mm. The composite sheet obtained was subjected to measurement of the line roughness Rz (maximum height) and arithmetic average roughness Ra, and evaluation of the thermal resistance and heat dissipation properties. The results are shown in Table 2.

TABLE 2

|  |  | Example 2 | Example 3 | Example 4 | Example 5 | Example 6 |
|---|---|---|---|---|---|---|
| Conditions of multi-cut wire saw | Wire reciprocating linear speed [mm/s] | 900 | 500 | 500 | 500 | 500 |
|  | Table moving speed [mm/s] | 0.5 | 0.1 | 2 | 0.5 | 0.5 |
|  | Sample width [mm] | 50 | 50 | 50 | 10 | 120 |
| Evaluation | Cuttability | A | A | A | A | A |
|  | Line roughness Rz [μm] | 4.2 | 3.0 | 5.0 | 3.0 | 5.0 |
|  | Arithmetic average roughness Ra [μm] | 0.8 | 0.6 | 0.9 | 0.6 | 0.8 |
|  | Thermal resistance | 0.7 | 0.6 | 0.8 | 0.7 | 0.8 |
|  | Heat dissipation properties | A | A | B | A | B |

Comparative Example 2

Composite sheets were prepared in the same manner as in Example 1 except that the wire reciprocating linear speed of the multi-cut wire saw was changed to 1200 mm/s. The composite sheets obtained each had a thickness of 0.40 mm. The composite sheet obtained was subjected to measurement of the line roughness Rz (maximum height) and arithmetic average roughness Ra, and evaluation of the thermal resistance and heat dissipation properties. The results are shown in Table 3.

Comparative Example 3

An attempt was made to prepare composite sheets in the same manner as in Example 1 except that the wire reciprocating linear speed of the multi-cut wire saw was changed to 500 mm/s and the table moving speed was changed to 5 mm/s, but the composite was not able to be cut from the resin-impregnated body into sheets. The results are shown in Table 3. In Table 3, "-" indicates that measurement was not performed.

TABLE 3

|  |  | Comparative Example 2 | Comparative Example 3 |
|---|---|---|---|
| Conditions of multi-cut wire saw | Wire reciprocating linear speed [mm/s] | 1200 | 500 |
|  | Table moving speed [mm/s] | 0.5 | 5 |
|  | Sample width [mm] | 50 | 50 |
| Evaluation | Cuttability | A | B |
|  | Line roughness Rz [μm] | 13 | — |
|  | Arithmetic average roughness Ra [μm] | 2.7 | — |
|  | Thermal resistance | 1.1 | — |
|  | Heat dissipation properties | C | — |

INDUSTRIAL APPLICABILITY

According to the present disclosure, there can be provided a composite sheet having excellent heat dissipation properties when laminated with a metal substrate, and a method for producing the same. According to the present disclosure, there also can be provided a laminate excellent in heat dissipation properties, and a method for producing the same.

REFERENCE SIGNS LIST 10, 110 Composite sheet
10a, 10b Principal surface
30 Wire
52 First metal substrate
53 Second metal substrate
100 Resin-impregnated body
130 Resin layer
150 Metal substrate
300 Laminate
500 Multi-cut wire saw

The invention claimed is:

1. A composite sheet comprising: a nitride sintered body having a porous structure; and a semi-cured product of a thermosetting resin composition impregnated into the nitride sintered body, wherein
    line roughness Rz (maximum height), specified in JIS B 0601: 2013, on at least one principal surface of the composite sheet is 10 μm or less.
2. The composite sheet according to claim 1, wherein an arithmetic average roughness Ra, specified by JIS B 0601: 2013, on the principal surface is 2.0 μm or less.
3. The composite sheet according to claim 1, wherein a content of the semi-cured product is from 20 to 70% by volume.
4. The composite sheet according to claim 1, having a thickness of 1.0 mm or less.
5. A method for producing a composite sheet according to claim 1, the method comprising cutting a resin-impregnated body comprising a nitride sintered body having a porous structure and a semi-cured product of a thermosetting resin composition impregnated into the nitride sintered body by use of a wire saw under conditions including a wire reciprocating linear speed of 155 to 1000 mm/min and a table moving speed of 4 mm/min or less, to obtain the composite sheet,
    wherein line roughness Rz, specified by JIS B 0601: 2013, on at least one principal surface of the composite sheet is 10 μm or less.
6. The method according to claim 5, wherein a width of the resin-impregnated body is from 5 to 150 mm.

7. A laminate comprising: a first metal substrate; an intermediate layer provided on the first metal substrate; and a second metal substrate provided on a side of the intermediate layer opposite to the first metal substrate, wherein the first metal substrate is connected to the second metal substrate via the intermediate layer, and wherein the intermediate layer is a cured product of the composite sheet according to claim 1.

8. The laminate according to claim 7, wherein line roughness Rz, specified by JIS B 0601: 2013, on the principal surfaces of the first metal substrate and the second metal substrate on side of the intermediate layer is 10 μm or less.

9. The laminate according to claim 7, wherein at least one of the first metal substrate and the second metal substrate includes at least one selected from the group consisting of copper and aluminum.

10. A method for producing a laminate comprising a composite sheet according to claim 1, a first metal substrate, and a second metal substrate, the method comprising disposing and laminating each of the first metal substrate and the second metal substrate so as to face a pair of principal surfaces of the composite sheet, heating the first metal substrate and the second metal substrate while the first metal substrate and the second metal substrate are pressurized in a laminating direction to cure the thermosetting resin composition, thereby connecting the composite sheet with the first metal substrate and the second metal substrate.

\* \* \* \* \*